United States Patent
Chung et al.

(10) Patent No.: US 7,042,036 B2
(45) Date of Patent: May 9, 2006

(54) MAGNETIC MEMORY USING SINGLE DOMAIN SWITCHING BY DIRECT CURRENT

(75) Inventors: Seok-Hwan Chung, Darien, IL (US); Axel F. Hoffmann, Chicago, IL (US)

(73) Assignee: The University of Chicago, Chicago, IL (US)

( * ) Notice: Subject to any disclaimer, the term of this patent is extended or adjusted under 35 U.S.C. 154(b) by 99 days.

(21) Appl. No.: 10/912,708

(22) Filed: Aug. 5, 2004

(65) Prior Publication Data
US 2006/0028863 A1 Feb. 9, 2006

(51) Int. Cl.
*H01L 29/76* (2006.01)
(52) U.S. Cl. .................... 257/295; 365/158; 365/172; 365/209
(58) Field of Classification Search .................. None
See application file for complete search history.

(56) References Cited

U.S. PATENT DOCUMENTS 6,768,670 B1 * 7/2004 Kim et al. .................. 365/173

FOREIGN PATENT DOCUMENTS

JP  2001093274  *  4/2001

OTHER PUBLICATIONS

Pulsed-Current-Induced Domain Wall Propagation in Permalloy Patterns Observed Using Magnetic Force Microscope by L. Gan, S.H. Chung, K. H. Aschenback, M. Dreyer, and R.D. Gomez, IEEE Transactions on Magnetics, vol., 36, No. 5, pp. 3047-3049, Sep. 2000.

* cited by examiner

*Primary Examiner*—David Nelms
*Assistant Examiner*—Hoang-Quan Ho
(74) *Attorney, Agent, or Firm*—Joan Pennington

(57) ABSTRACT

A method for implementing miniaturization of magnetic random access memory (MRAM) and a magnetic memory using single domain switching by direct current are provided. The magnetic memory preferably includes a half-circle or U-shaped architecture with an exchange biasing pad, such as a FeMn exchange biasing pad that effectively generates a head-to-head magnetization configuration. The magnetic memory also includes nanometer scale notches in order to minimize magnetostatic interaction between a single domain memory element and the spin current sources and to effectively trap the magnetic domain wall. Reading the bit can be carried out by anisotropic magnetoresistance, or by other means of determining the magnetization orientation through resistance measurements, such as a spin valve or a magnetic tunneling junction.

15 Claims, 3 Drawing Sheets

MAGNETIC MEMORY USING SINGLE DOMAIN SWITCHING BY DIRECT CURRENT

CONTRACTUAL ORIGIN OF THE INVENTION

The United States Government has rights in this invention pursuant to Contract No. W-31-109-ENG-38 between the United States Government and Argonne National Laboratory.

FIELD OF THE INVENTION

The present invention relates to a method for implementing miniaturization of magnetic random access memory (MRAM) and a magnetic memory using single domain switching by direct current.

DESCRIPTION OF THE RELATED ART

The development of magnetic random access memory (MRAM) is currently of great interest to the electronics industry due to its promise of high density, fast speed, lower power consumption and non-volatility. MRAM should combine the high speed of a conventional static RAM, the storage capacity of a dynamic random access memory (DRAM) and the non-volatility of flash memory.

The realization of most magnetic memory and spin-dependent devices is intricately related to the ability to change the magnetization of one or more of the active elements. A common way of switching the magnetization is by generating an external magnetic write field higher than the coercivity of the ferromagnetic layer, which is used to encode the information. However, a potential drawback for this technique is the need for a high external current to induce magnetization reversal. Further, as the critical dimensions decrease, the field localization for selective switching could become a critical concern.

Conventional MRAM employs a current-induced magnetic field external to the memory cell in the write mode. This field is reversed to respectively write a zero (0) or a one (1). A field external to the cell inherently limits the achievable cell density as an adjacent stray external field can influence adjacent cells.

There are significant hurdles to be overcome, such as the reduction of cross-talk between the magnetic memory elements during the write cycle due to the high density packing.

Alternative techniques are being explored for changing the local magnetization other than direct field generation. One recently proposed voltage controlled rotation (VCR) is very appealing, but the fabrication requirements appear to be quite stringent.

A publication entitled "Pulsed-Current-lnduced Domain Wall Propagation in Permalloy Patterns Observed Using Magnetic Force Microscope" by L. Gan, S. H. Chung, K. H. Aschenbach, M. Dreyer, and R. D. Gomez, IEEE Transactions on Magnetics, Vol, 36, No. 5, pps. 3047–3049, September 2000, discloses exploiting the well-known phenomena of domain drag induced by current pulses and applying the technique to microscale patterned Permalloy structures. The devices that could potentially benefit from these investigations are magnetic tunnel junctions, as well as MRAMs and spin transistors that utilize Permalloy as a spin sensing electrode. The paper describes domain wall motion in patterned 100–160 nm thick Permalloy films and demonstrates the technical feasibility of moving domains with directional specificity. The subject matter of the above-identified publication is incorporated herein by reference.

A principal object of the present invention is to provide a method for implementing miniaturization of magnetic random access memory (MRAM) and a magnetic memory using single domain switching by direct current pulse.

SUMMARY OF THE INVENTION

In brief, the present invention provides a method for implementing miniaturization of magnetic random access memory (MRAM) and a magnetic memory using single domain switching by direct current pulse. The magnetic memory includes a structure formed of a ferromagnetic, metallic material defining a single domain island. The single domain island includes a first domain wall position and a second opposing domain wall position. The first domain wall position and second opposing domain wall position are formed by constrictions formed in respective opposed portions of the magnetic memory device.

In accordance with features of the invention, a magnetic memory is provided that substantially eliminates cross-talk by switching a single domain island through current induced domain wall motion for writing information with current polarity. This is achieved with a current source and current leads with well-defined magnetization, which generate a well-defined spin polarized current at the location of the single domain island.

The magnetic memory of the invention uses a half-circle or U-shaped architecture with an exchange biasing pad, incorporating any suitable antiferromagnetic material such as a FeMn exchange biasing pad, that effectively generates a stable head-to-head magnetization configuration. The magnetic memory also includes nanometer scale notches in order to minimize magnetostatic interaction between a single domain memory element and the spin current sources and to effectively trap the magnetic domain wall. Reading the bit can be carried out by anisotropic magnetoresistance, or by other means of determining the magnetization orientation through resistance measurements, such as a spin valve or a magnetic tunneling junction.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
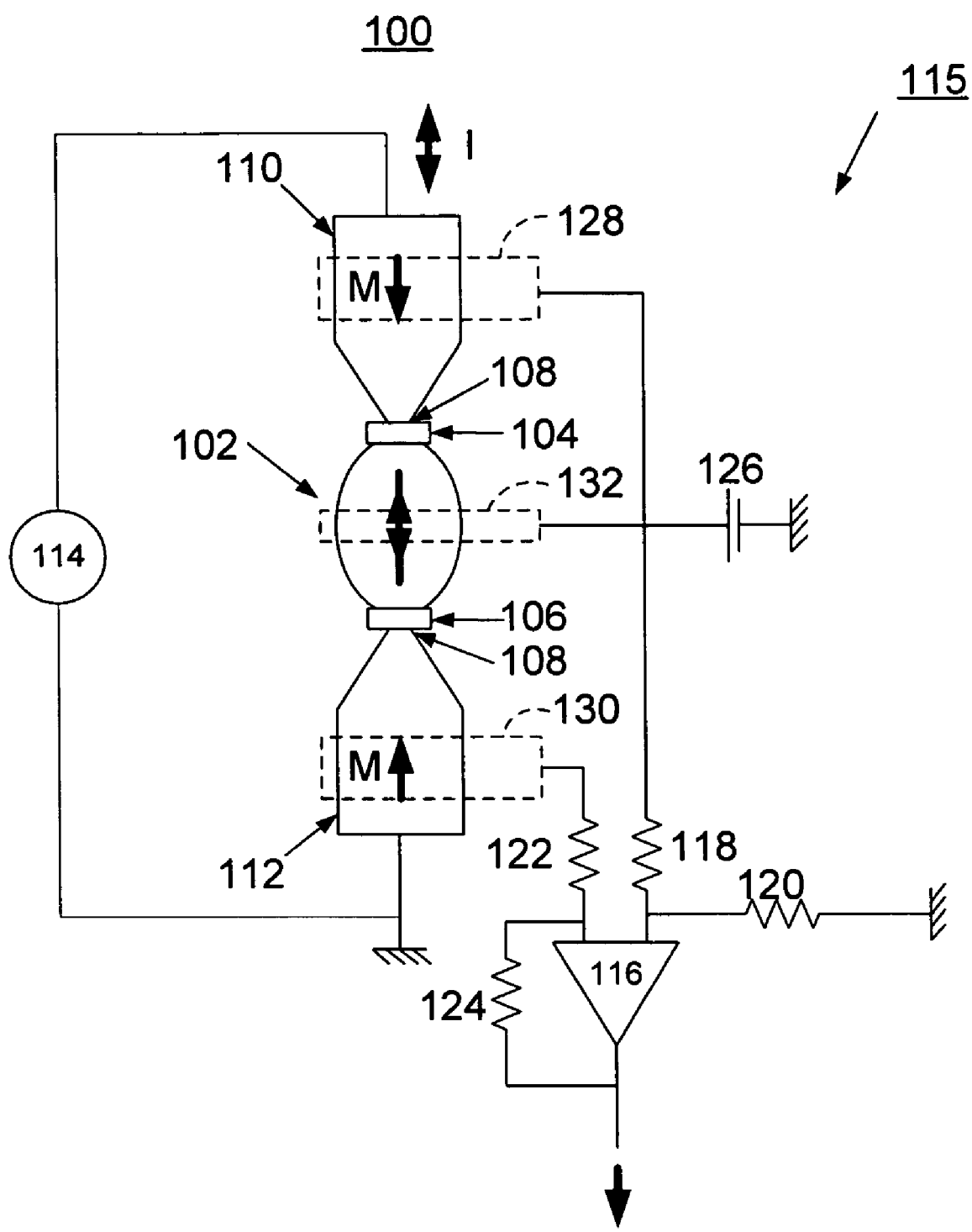
FIG. 1 is a schematic and block diagram representation of a magnetic memory device of the invention.

In accordance with features of the invention, a magnetic memory device is provided that substantially eliminates cross-talk by switching a single domain element or island through current induced domain wall motion and by writing information with current polarity as illustrated and described with respect to FIG. 1. This is achieved with a current source and current leads with well-defined magnetization, which generate a well defined spin polarized current at the location of the single domain island. The magnetic memory device of the preferred embodiment uses a half-circle architecture with an exchange biasing pad using any suitable antiferromagnetic material such as FeMn, as illustrated and described with respect to FIG. 4, that can generate a stable head-to-head magnetization configuration. This stable head-to-head magnetization configuration assures that only one magnetic domain wall is present in the given magnetic memory cell. The magnetic memory cell of the invention also includes nanometer scale notches, for example, as illustrated and described with respect to FIG. 4, in order to minimize magnetostatic interaction between a single domain memory element and the spin current sources and to effectively trap the magnetic domain wall. Reading a stored bit preferably is carried out by anisotropic magnetoresistance (AMR), as illustrated and described with respect to FIGS. 2 and 3.

Having reference now to the drawings, in FIG. 1 there is shown a magnetic memory device of the invention generally designated by reference character 100. . The magnetic memory device 100 includes a single domain island 102 with an elliptical shape connected to the two spin-injection pads via a pair of nanometer scale constrictions 108. These nanometer scale constrictions 108 effectively trap the magnetic domain wall either at position 104 or position 106. These two possible domain wall positions 104 and 106 represent bit "0" and "1" respectively. The pair of constrictions 108 is formed in respective opposed portions 110, 112 of the elongate magnetic memory device 100 with the single domain island 102 extending between the opposing constrictions 108.

Directions of magnetizations labeled M of the respective opposed portions 110, 112 of the elongate magnetic memory device 100 are made antiparallel through the half-circle or U-shaped geometry. Therefore a single magnetic domain wall is formed either at position 104 or 106 depending on the orientation of magnetization of the single domain island 102, up or down respectively. A direct current source 114 is connected to the magnetic memory device 100 between the respective opposed portions 110, 112 with a ground potential connection at the portion 112. The opposing magnetizations in portions 110 and 112 will then generate oppositely spin-polarized current at the location of the single domain island 102 depending on the current polarity of the current source 114. Therefore portions 110 and 112 are effectively spin-injection pads. The magnetic memory device 100 can be formed of any ferromagnetic and metallic material, such as a Permalloy.

Writing a zero or a one is provided by selectively reversing a current polarity of the current source 114 for switching the single domain island 102 through current induced domain wall motion. For example, the relative orientation of magnetic states of a zero or a one of the single domain island 102 are changed corresponding to the current polarity, selectively moving the domain wall between the first domain wall position 104 and the second opposing domain wall position 106. Respective opposing constrictions 108 adjacent to the first domain wall position 104 and the second opposing domain wall position 106 functions to keep the domain wall in place or effectively trap the magnetic domain wall.

In accordance with features of the invention, the magnetic memory device 100 reduces the critical current for domain wall motion as compared to conventional MRAM designs using an external magnetic field for magnetization control. The magnetic memory device 100 enables easier fabrication eliminating the need for the required multiple layers of such conventional MRAM designs. The magnetic memory device 100 enables easier miniaturization, avoiding the cross-talk problem and hard localization of conventional MRAM designs using an external magnetic field for magnetization control.

Reading the magnetic memory device 100 is implemented with an exemplary anisotropic magnetoresistance (AMR) read circuit generally designated by reference character 115. Read circuit 115 includes an operational amplifier 116 together with a plurality of biasing resistors 118, 120, 122, 124 and a voltage source 126. The biasing resistors 118, 122 are respectively connected between an input of a differential operational amplifier 116 and a first electrode 128 and a second electrode 130. The first electrode 128 and the second electrode 130 are connected to the respective opposed portions 110, 112 of the elongate magnetic memory device 100. A third electrode 132 is connected between the single domain island 102 and the voltage source 126. A resistance difference between the first electrode 128 and the second electrode 130 is detected by read circuit 115 with an output of the operational amplifier 116 indicating a zero or a one stored by the magnetic memory device 100.

Figure 2:
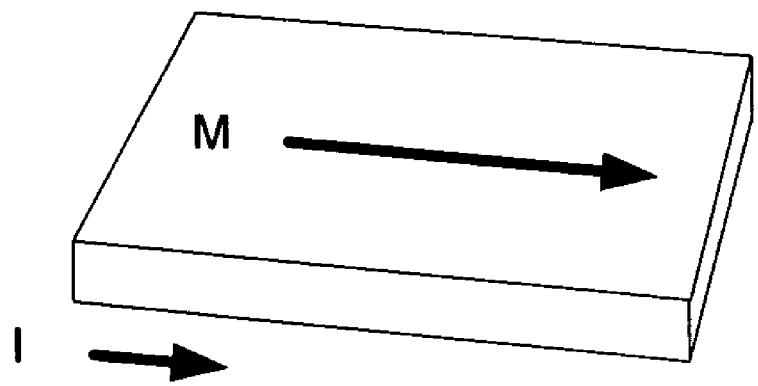
FIGS. 2 and 3 are diagrams illustrating anisotropic magnetoresistance reading of the magnetic memory device of FIG. 1 in accordance with the invention.
Figure 3:
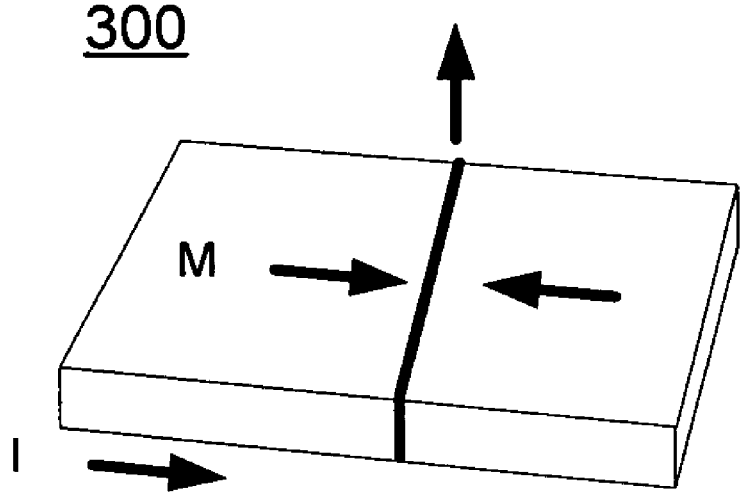

Referring also to FIGS. 2 and 3, reading the stored bit or magnetic state of the single domain island 102 preferably is carried out by anisotropic magnetoresistance (AMR).

In FIG. 2, there is shown a higher resistance portion of the magnetic memory device 100 generally designated by reference character 200. Higher resistance results where the magnetic moment M is parallel or antiparallel to current flow 1. This is the case when there is no domain wall present at either position 104 or 106.

In FIG. 3, there is shown a lower resistance portion of the magnetic memory device 100 generally designated by reference character 300. Lower resistance results where the magnetic moment M is perpendicular to current flow 1. A domain wall between head-to-head magnetic domains will have a magnetic moment in the plane of the domain wall. Therefore the low resistance will occur when there is a domain wall present at either position 104 or 106.

Reading the magnetic memory device 100 by anisotropic magnetoresistance (AMR) tests for the presence of the magnetic domain wall at the first domain wall position 104 or the second opposing domain wall position 106 in FIG. 1. When magnetic domain wall is trapped at either one of the notches 108, magnetization is perpendicular to the direction of the current flow. This provides the low resistance state. When no magnetic domain wall exists at the notch, magnetization is parallel of antiparallel to the direction of the current flow. This provides the high resistance state.

Figure 4:
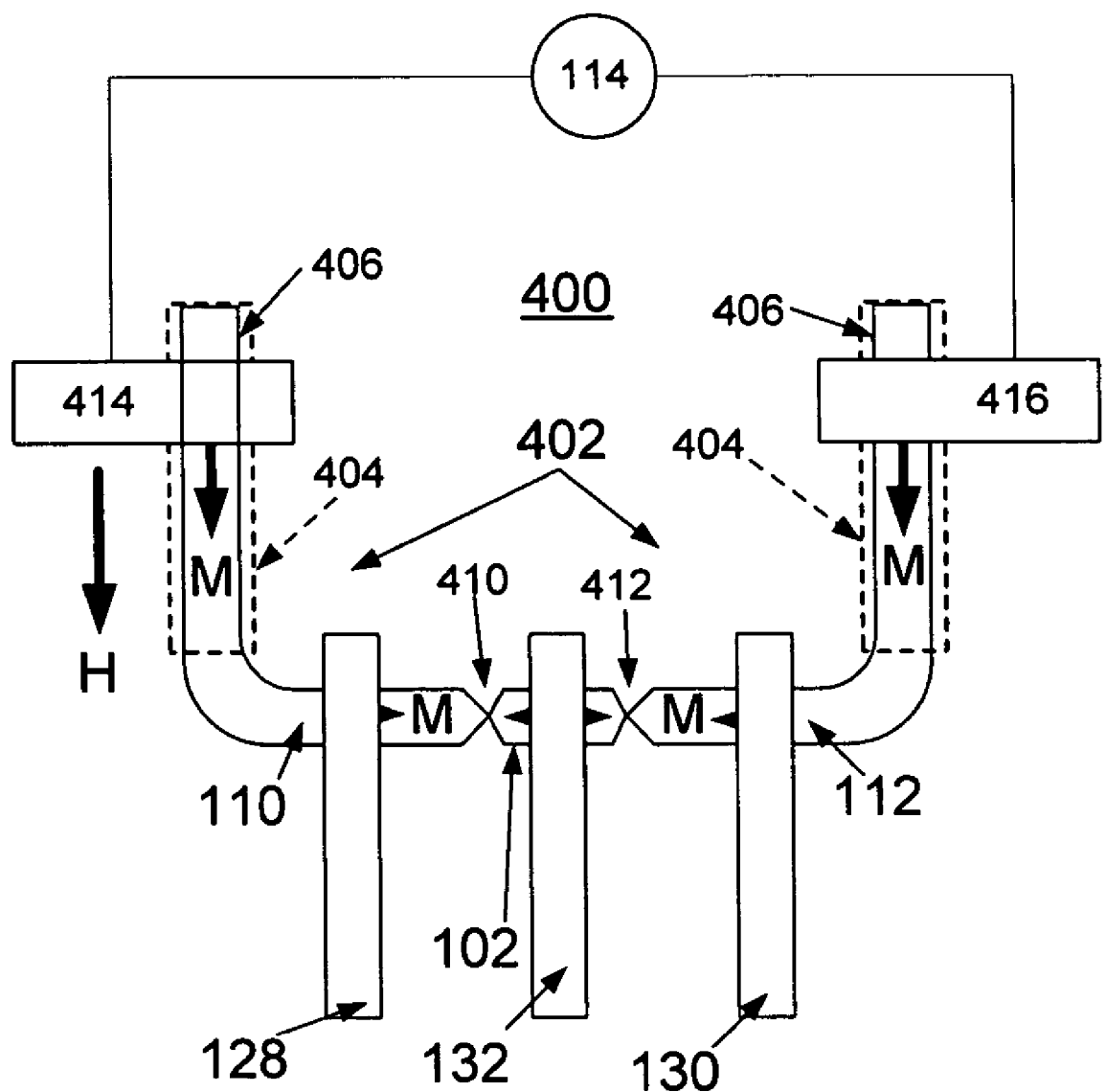
FIG. 4 is a schematic and block diagram representation illustrating a preferred configuration of the magnetic memory device of FIG. 1 in accordance with the invention.

Referring also to FIG. 4 there is shown a preferred configuration of the magnetic memory device 100 generally designated by reference character 400 in accordance with the invention. The magnetic memory device configuration 400 includes a half-circle or U-shaped architecture generally designated by reference character 402 with an exchange biasing pad 404, made out of any suitable antiferromagnetic material such as a FeMn exchange biasing pad, provided together with respective upper, generally parallel arm portions 406 of the U-shaped configuration 402.

Exchange biasing pads 404 are provided to effectively generate a stable head-to-head magnetization configuration at the single domain island 102 and between memory device portions 110 and 112.

The magnetic device configuration 400 also includes a plurality of nanometer scale notches 410, 412 in order to minimize magnetostatic interaction between a single domain memory island 102 and the spin-injection pads 110, 112 and to effectively trap the magnetic domain wall at positions 410 and 412. The nanometer scale notches 410, 412 serve to isolate the single domain island 102 magnetically, thus trapping the domain wall at the desired location.

The current source 114 is connected between a pair of electrodes 414, 416. Electrodes 414, 416 are connected to the respective upper generally parallel arm portions 406 of the U-shaped configuration 402. The domain wall is moved by a direct current pulse provided by current source 114 through the parallel arm portions 406, which generate the spin-polarized current. Consequently, depending on the polarity of the current pulse the domain wall positions selectively proximate either of the opposed notches 410, 412.

The presence of the domain wall provides a relative low resistance to current flow, thus the zero or one is established by positioning the domain wall at either one of the predefined notch 410, 412. The state of the magnetic memory device 100 is then read as a zero or one using an anisotropic magnetoresistance (AMR) read circuit 115 of FIG. 1 connected to the illustrated electrodes 128, 132, 130.

In accordance with features of the invention, the use of direct current pulses through the magnetic memory device 100 to switch the single domain magnetization, rather than to induce a larger magnetic field external to the cell, substantially decreases the overall area affected by stray fields thus addressing a constraint to increased cell density. Additionally, the memory device configuration 400 with the notches 410, 412 provides a simple configuration for fabrication. It should be understood that reading the bit could be carried out by anisotropic magnetoresistance, or by other means of determining the magnetization orientation through resistance measurements, such as a spin valve or a magnetic tunneling junction.

While the present invention has been described with reference to the details of the embodiments of the invention shown in the drawing, these details are not intended to limit the scope of the invention as claimed in the appended claims.

What is claimed is:

1. A magnetic memory device comprising:
    a structure formed of a ferromagnetic, metallic material defining a single domain island;
    said single domain island being connected to a pair of spin-injection pads via a pair of nanoscale constrictions defining a first domain wall position and a second opposing domain wall position; and
    a direct current source connected to the magnetic memory device for single domain switching.

2. A magnetic memory device as recited in claim 1 wherein said structure includes a generally U-shaped configuration.

3. A magnetic memory device as recited in claim 2 wherein said U-shaped configuration includes a pair of spaced apart, generally parallel arm portions extending generally perpendicular to said single domain island.

4. A magnetic memory device as recited in claim 3 includes an exchange biasing pad provided together with respective generally parallel arm portions.

5. A magnetic memory device as recited in claim 4 wherein said exchange biasing pad include a layer formed of a selected antiferromagnetic material selected from a group including FeMn.

6. A magnetic memory device as recited in claim 1 wherein said constrictions include nanometer scale notches for isolating said single domain island magnetically.

7. A magnetic memory device as recited in claim 1 wherein said direct current source switches said single domain island through current induced domain wall motion for writing information with current polarity.

8. A magnetic memory device as recited in claim 1 wherein said direct current source provides a spin polarized current through said spin-injection pads.

9. A magnetic memory device as recited in claim 2 wherein said direct current source is connected between said pair of spaced apart, generally parallel arm portions.

10. A magnetic memory device as recited in claim 1 includes an anisotropic magnetoresistance (AMR) read circuit for reading a state of said single domain island.

11. A magnetic memory device as recited in claim 10 wherein said anisotropic magnetoresistance (AMR) read circuit includes an operational amplifier and a plurality of biasing resistors connected to said operational amplifier and a pair of electrodes connected to said opposed portions of the elongate magnetic memory device.

12. A magnetic memory device as recited in claim 11 wherein said anisotropic magnetoresistance (AMR) read circuit further includes a voltage source connected to said single domain island.

13. A magnetic memory as recited in claim 11 wherein said operational amplifier of said anisotropic magnetoresistance (AMR) read circuit provides an output indicating a zero or a one stored by the magnetic memory device.

14. A magnetic memory as recited in claim 13 wherein said zero or said one stored by the magnetic memory device is selectively written by said direct current single domain switching through current induced domain wall motion with current polarity.

15. A method for implementing a magnetic random access memory (MRAM) comprising the steps of:
    providing a magnetic memory structure formed of a thin film patterned structure of ferromagnetic, metallic material defining a single domain island; said single domain island being connected to a pair of spin-injection pads via nanoscale notches defining a first domain wall position and a second opposing domain wall position;
    providing a direct current source coupled to said magnetic memory structure for writing information with current polarity for selectively switching a magnetic state of said single domain island through current induced domain wall motion between a first domain wall position and a second opposing domain wall position;
    providing a read circuit coupled to said magnetic memory structure for reading said magnetic state of said single domain island.

* * * * *